United States Patent
Anderes et al.

(10) Patent No.: US 11,934,680 B2
(45) Date of Patent: Mar. 19, 2024

(54) SYSTEMS AND METHODS FOR BOOTING FROM NAND FLASH USING SQUASHFS TO MAXIMIZE MEMORY

(71) Applicant: ARRIS Enterprises LLC, Suwanee, GA (US)

(72) Inventors: Walter H. Anderes, San Diego, CA (US); Richard P. Rementilla, San Diego, CA (US); David L. Berger, El Cajon, CA (US)

(73) Assignee: ARRIS Enterprises LLC, Horsham, PA (US)

( * ) Notice: Subject to any disclaimer, the term of this patent is extended or adjusted under 35 U.S.C. 154(b) by 13 days.

(21) Appl. No.: 17/161,254

(22) Filed: Jan. 28, 2021

(65) Prior Publication Data

US 2021/0247921 A1 Aug. 12, 2021

Related U.S. Application Data

(60) Provisional application No. 62/970,852, filed on Feb. 6, 2020.

(51) Int. Cl.
*G06F 3/06* (2006.01)
*G06F 9/4401* (2018.01)
(Continued)

(52) U.S. Cl.
CPC .......... *G06F 3/0644* (2013.01); *G06F 3/0604* (2013.01); *G06F 3/0679* (2013.01);
(Continued)

(58) Field of Classification Search
CPC .... G06F 3/0644; G06F 3/0604; G06F 3/0679; G06F 9/4403; G06F 16/119; G06F 16/128; G06F 8/654; G11C 29/10
See application file for complete search history.

(56) References Cited

U.S. PATENT DOCUMENTS

| | | |
|---|---|---|
| 8,970,884 B2 | 3/2015 | Tsuji et al. |
| 9,507,584 B2 | 11/2016 | Tsuji |

(Continued)

FOREIGN PATENT DOCUMENTS

| | | | |
|---|---|---|---|
| CN | 104834547 A | 8/2015 | |
| CN | 106598576 A | 4/2017 | |
| EP | 2611129 A1 * | 7/2013 | ........... G06F 3/0626 |

OTHER PUBLICATIONS

Notification of Transmittal of the International Search Report (Forms PCT/ISA/220 and PCT/ISA/210) and the Written Opinion of the International Searching Authority (Form PCT/ISA/237) dated May 24, 2021, by the International Application Division Korean Intellectual Property Office in corresponding International Application No. PCT/US2021/015714. (10 pages).

(Continued)

*Primary Examiner* — Edward J Dudek, Jr.

(74) *Attorney, Agent, or Firm* — Panitch Schwarze Belisario & Nadel LLC

(57) ABSTRACT

Embodiments of the systems and methods disclosed herein includes a NAND flash memory having a boot volume. The boot volume can include a primary boot partition, a secondary boot partition, and a rootdisk partition. The primary boot partition can be configured to receive a kernel component of a file. The secondary boot partition can be configured to receive a copy of the kernel component of the file. The rootdisk partition can be configured to receive a root filesystem of the file.

12 Claims, 5 Drawing Sheets

(51) Int. Cl.
*G06F 16/11* (2019.01)
*G11C 29/10* (2006.01)
*G06F 8/654* (2018.01)

(52) U.S. Cl.
CPC .......... *G06F 9/4403* (2013.01); *G06F 16/119* (2019.01); *G06F 16/128* (2019.01); *G11C 29/10* (2013.01); *G06F 8/654* (2018.02)

(56) References Cited

U.S. PATENT DOCUMENTS

| | | | |
|---|---|---|---|
| 9,563,418 | B1 | 2/2017 | Walton |
| 10,025,600 | B2 | 7/2018 | Ehrenberg et al. |
| 2005/0132123 | A1 | 6/2005 | Glaum et al. |
| 2007/0192654 | A1* | 8/2007 | Lauterbach ......... G06F 11/2289 714/36 |
| 2013/0103884 | A1* | 4/2013 | Cho ..................... G06F 12/0246 711/E12.007 |
| 2013/0163040 | A1 | 6/2013 | Tsuji et al. |
| 2014/0122329 | A1* | 5/2014 | Naggar .............. G06Q 20/3552 705/41 |
| 2014/0237461 | A1* | 8/2014 | Kamity ................... G06F 8/658 717/169 |
| 2015/0149759 | A1 | 5/2015 | Tsuji |
| 2017/0097830 | A1 | 4/2017 | Ehrenberg et al. |
| 2020/0210272 | A1* | 7/2020 | Zhang ................. G06F 12/0246 |

OTHER PUBLICATIONS

Opdenacker., "Managing flash storage with Linux," Bootlin, (Dec. 2, 2012), https://bootlin.com/blog/managing-flash-storage-with-linux/, pp. 1-30.

* cited by examiner

SYSTEMS AND METHODS FOR BOOTING FROM NAND FLASH USING SQUASHFS TO MAXIMIZE MEMORY

TECHNICAL FIELD

Embodiments relate to systems and methods for maximizing memory by booting from raw NOT-AND (NAND) flash using Squash File System (squashfs).

BACKGROUND

Some devices having a NAND flash to store software images use a boot volume as part of the memory. Examples of such devices can be a set-top box, a Memory Technology Device (MTD), etc. A set-top box is an information appliance device configured to convert a source signal (e.g., a signal representing a digital image) into content that can be displayed on a display (e.g., a television display screen). Set-top boxes can be configured for use with cable television systems, satellite television systems, internet television systems, over-the-air television systems, etc. Set-top box is the generic term to encompass "cable boxes", "satellites boxes", "telco boxes", etc. A boot volume which resides on a device (e.g., flash memory, embedded Multi-Media Controller (eMMC) memory, hard disk, etc.) contains persistent data (e.g., machine code) to be loaded to Random Access Memory (RAM) upon boot up of the device and then executed by a computer system's central processor.

With increasing processing power and more efficient data transmissions, software images are becoming increasingly larger. Yet, the boot volume's memory remains limited. In some instances, the software image is so large that it is at or near the memory capacity of the boot volume. This poses a problem when it is desired to add new features, because the limited memory of the boot volume prevents or inhibits increasing the size of the software image any further.

SUMMARY

A digital image processing device (e.g., a set-top box) can have a processor configured to run software (e.g., an operating system). When a digital image processing device is turned off, the software is typically stored in non-volatile memory. When the digital image processing device is turned back on (i.e., booted), it does not have immediate access to that software, and so a boot loader executes a program to start a boot sequence that will pull data and programs from the boot volume. After the boot sequence is completed, the processor of the digital image processing device then loads into RAM and executes the kernel, i.e., the operating system. NAND flash memory is a type of non-volatile storage technology that can be used with a digital image processing device. It typically does not require power to retain data, and is therefore useful during boot up of a device.

A NAND flash includes a boot volume from which data and programs are pulled during boot up. Typical NAND flash boot volumes have a primary boot partition and a secondary boot partition. The primary boot partition contains the software image file and the root filesystem (e.g., supporting software libraries). The secondary boot partition is a back-up for the primary partition in case the primary partition fails. Embodiments of the disclosed NAND flash, however, have a boot volume that includes a primary boot partition, a secondary boot partition, and a rootdisk partition. With the disclosed NAND flash, each of the primary boot partition and secondary boot partition can be configured to only contain a software package kernel component of the software image (the secondary partition being a back up for the primary partition). The rootdisk partition can be configured to contain the root filesystem. With this boot volume configuration, only one copy of the root filesystem is stored in the boot volume, thereby freeing up space for updates and new features.

Because there is only one copy of the root filesystem in the NAND flash boot volume, a copy of the root filesystem is stored in the Unsorted Block Image File System (UBIFS). This is achieved by compressing a copy of the root filesystem into a squashfs image. The squashfs image is then written directly to the NAND flash (as opposed to creating an Unsorted Block Image (UBI) layer on top of the rootdisk partition). The squashfs image can then be mounted directly from the NAND flash and/or from the UBIFS. The ability to mount the squashfs image directly from the NAND flash and/or from a UBIFS volume provides the ability to upgrade in the background and improves boot time by obviating the need to copy the root filesystem from the NAND flash to UBIFS. This is in further contrast to typical memory set-ups, wherein the squashfs image would be installed on top of a UBI layer inside a UBIFS volume, leading to a higher overhead cost.

The ability to mount the squashfs image directly from the NAND flash and/or from a UBIFS volume also maximizes the amount of space available to the rootdisk partition—allowing more features to be added to the NAND flash and/or the software package of the digital image processing device.

As noted herein, with embodiments of the disclosed NAND flash, the squashfs image can be mounted directly from the NAND flash. The mounting process can involve the use of a scan utility to identify bad blocks within a rootdisk partition. For instance, if bad blocks exist, the squashfs image will not be mountable because the squashfs image will have been fragmented. Embodiments of the disclosed system, however, can use a scan utility to identify the bad blocks within the rootdisk partition and to generate a table. A device-mapper engine can use this table to render a complete rootdisk image of the root filesystem (e.g., de-fragment the squashfs image to make it whole again). The device-mapper engine can achieve this by filling in holes of the identified bad-blocks within the table. Thereafter, the device-mapper engine can mount the root filesystem as a normal squashfs image.

In an exemplary embodiment, a non-volatile memory can include a NOT-AND (NAND) flash memory having a boot volume. The boot volume can include: a primary boot partition; a secondary boot partition; and a rootdisk partition.

In some embodiments: the primary boot partition is configured to receive a kernel component of a file; the secondary boot partition is configured to receive a copy of the kernel component of the file; and the rootdisk partition is configured to receive the root filesystem of the file.

In some embodiments, the file includes a software package or a software package update.

In an exemplary embodiment, a digital image processing device can include a memory having a NOT-AND (NAND) flash memory. The NAND flash can have a boot volume, the boot volume including: a primary boot partition; a secondary boot partition; and a rootdisk partition. The digital image processing device can further have a processor in operative association with the memory, the processor configured to operate via a device-mapper engine.

In some embodiments: the primary boot partition is configured to receive a kernel component of a file; the secondary boot partition is configured to receive a copy of the kernel component of the file; and the rootdisk partition is configured to receive the root filesystem of the file.

In some embodiments, the file includes a software package or a software package update.

In some embodiments, the device-mapper engine is configured to split the file into the kernel component and the root filesystem.

In some embodiments, the device-mapper engine is configured to: send the kernel component to the primary boot partition; send a copy of the kernel component to the secondary boot partition; and send the root filesystem to the rootdisk partition.

In some embodiments, the processor is configured to generate a Squash File System (squashfs) image of a copy of the root filesystem.

In some embodiments, the memory includes an Unsorted Block Image File System (UBIFS). The processor is configured to write the squashfs image to the UBIFS.

In some embodiments, the processor is configured to write the squashfs image to the UBIFS via a skip-block algorithm.

In some embodiments, the device-mapper engine is configured to mount the squashfs image directly from the NAND flash.

In some embodiments, the processor is configured to operate via a scan utility, the scan utility configured to identify bad data blocks.

In some embodiments, the scan utility is configured to generate a block table comprising the bad data blocks.

In some embodiments, the squashfs image is fragmented due to bad data blocks. The device-mapper engine is configured to use the block table to render a complete squashfs image.

In an exemplary embodiment, a method for improving memory capacity in a NOT-AND (NAND) flash memory can involve: partitioning a boot volume of the NAND flash into a primary boot partition, a secondary boot partition, and a rootdisk partition.

Some embodiments can involve: receiving a kernel component of a file within the primary boot partition; receiving a copy of the kernel component of the file within the secondary boot partition; and receiving the root filesystem of the file within the rootdisk partition.

Some embodiments can involve splitting a file into a kernel component and a root filesystem.

In some embodiments, the file includes a software package or a software package update.

Some embodiments involve generating a Squash File System (squashfs) image of a copy of the root filesystem.

DETAILED DESCRIPTION

Figure 1:
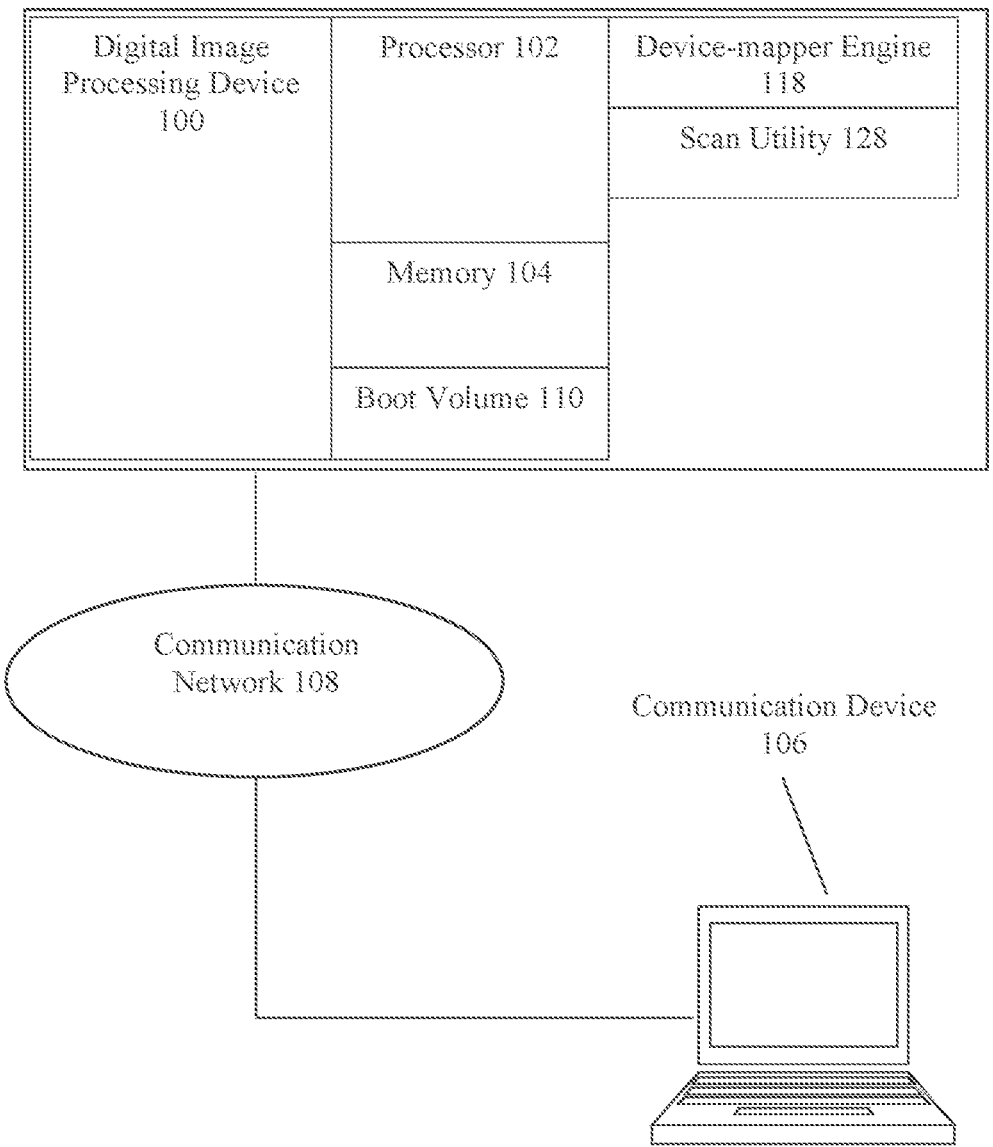
FIG. 1 is an exemplary block diagram showing component parts of an embodiment of a digital image processing device.
Figure 2:
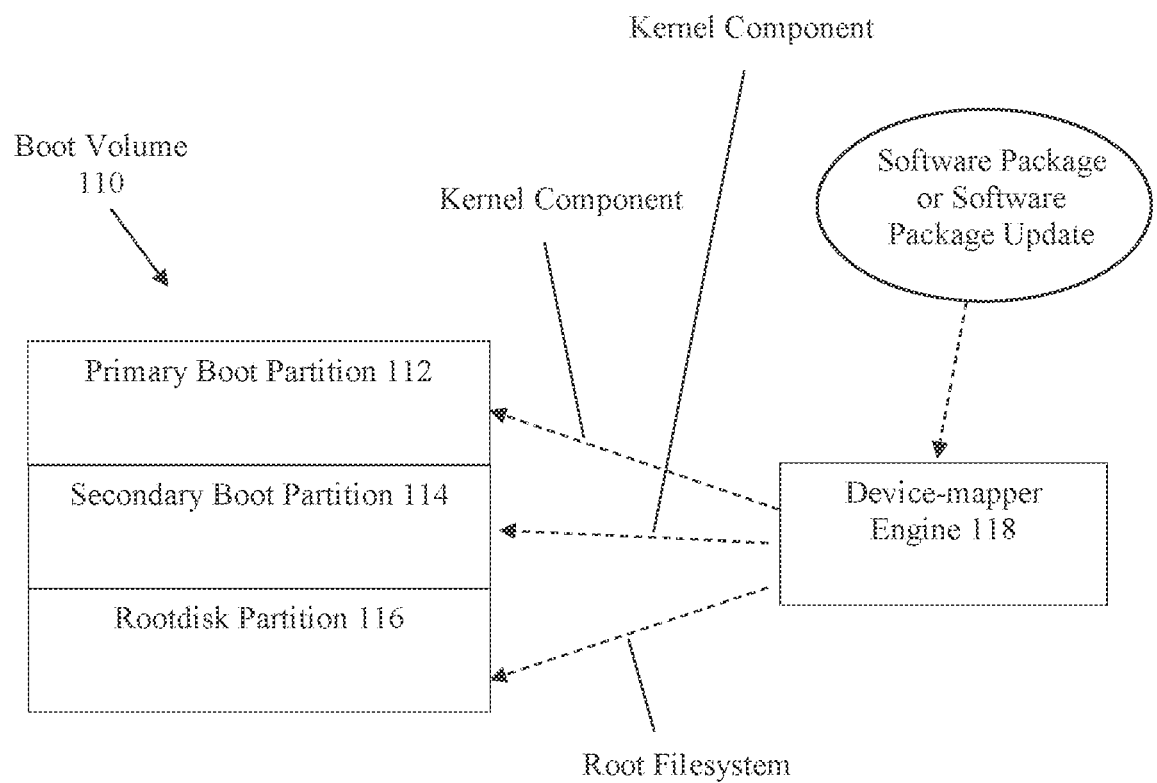
FIG. 2 is an exemplary block diagram showing an exemplary device-mapper engine operation for mapping a software image to an embodiment of the NAND flash.

Referring to FIGS. 1-2, embodiments can include a digital image processing device 100 having a processor 102 and memory 104. The processor 102 can be programmed to operate in accordance with software modules (operating system, drivers, engines, utilities, etc.) that are stored in the memory 104. The digital image processing device 100 can be a set-top box, a broadband device, a multimedia device, etc. The digital image processing device 100 can also include, or be in connection with, transceivers, gateways, modems, etc. to facilitate data and transmission/reception, processing, storing, etc. to and from other processing devices, displays, etc. In some embodiments, the digital image processing device 100 can be configured to act as a network node equipped to interface with a communication device 106 operating on a communication protocol that differs from the communication protocol it is operating on. This can facilitate the digital image processing device 100 communicating over a communication network 108 so as to permit it to receive software and/or firmware updates from the communication device 106. In an exemplary embodiment, the digital image processing device 100 is a set-top box acting as a network node equipped to interface with a communication device 106 such that the set-up box receives software packages or software package updates from the communication device 106.

The memory 104 can include a NAND flash memory 104 configured to have a boot volume 110. The boot volume 110 can have a primary boot partition 112, a secondary boot partition 114, and a rootdisk partition 116. The boot volume 110 is a memory component that contains persistent data to be loaded to a RAM component 132, which will be executed by the processor 102 in accordance with the digital image processing device 100 software package.

The digital image processing device 100 can include a device-mapper engine 118 (e.g., the processor 102 can be programed to operate via a device-mapper engine 118). The device-mapper engine 118 can be a software module configured to perform volume management. In some embodiments, the device-mapper engine 118 can map physical block devices onto higher-level virtual block devices. For instance, data being transmitted to and from the digital image processing device 100 can be blocked. A block of data can be a physical record of a sequence of bytes or bits having a maximum length—i.e., a block size. Blocked data is normally stored in a data buffer and read or written in block segments (a whole block at a time). A block device is an interface to a driver that appears in a file system as if it were an ordinary file. A physical block device is a connector object that represents the interface configured for storing configuration fields that are used to connect to, and interact with, a given storage target. A virtual block device is an interface with applications that appears to the applications as a block device. The device-mapper engine 118 targets can be stacked on top of each other, making it possible to implement complex data transformations.

The device-mapper engine 118 can also verify boot implementation based on a virtual block device integrity checking target scheme. For instance, the device-mapper engine 118 can be configured to cause the virtual block device to perform a data deduplication operation on files being received at the virtual block device level. This can be done by requiring one or more files accessed via the virtual block device to have at least one block that is shared by the one or more files.

When the digital image processing device 100 receives a software package or a software package update, the device-mapper engine 118 may split the software package or software package update into a software package kernel component (e.g., the operating system) and a the root filesystem (e.g., the application software). The software package file component is configured as a bootable kernel so as to facilitate communication between the processor 102 of the digital image processing device 100 and the NAND flash 104 at the beginning of the boot sequence. The root filesystem is the top directory of the file system within the operating system of the digital image processing device 100. The device-mapper engine 118 causes a first copy of the software package kernel component to be stored in the primary boot partition 112. The device-mapper engine 118 causes a second copy of the software package kernel component to be stored in the primary boot partition 112. The device-mapper engine 118 causes a copy of the root filesystem to be stored in the rootdisk partition 116. With this boot volume 110 configuration and software image mapping scheme, only one copy of the root filesystem is stored, thereby freeing up space for updates and new features.

Figure 3:
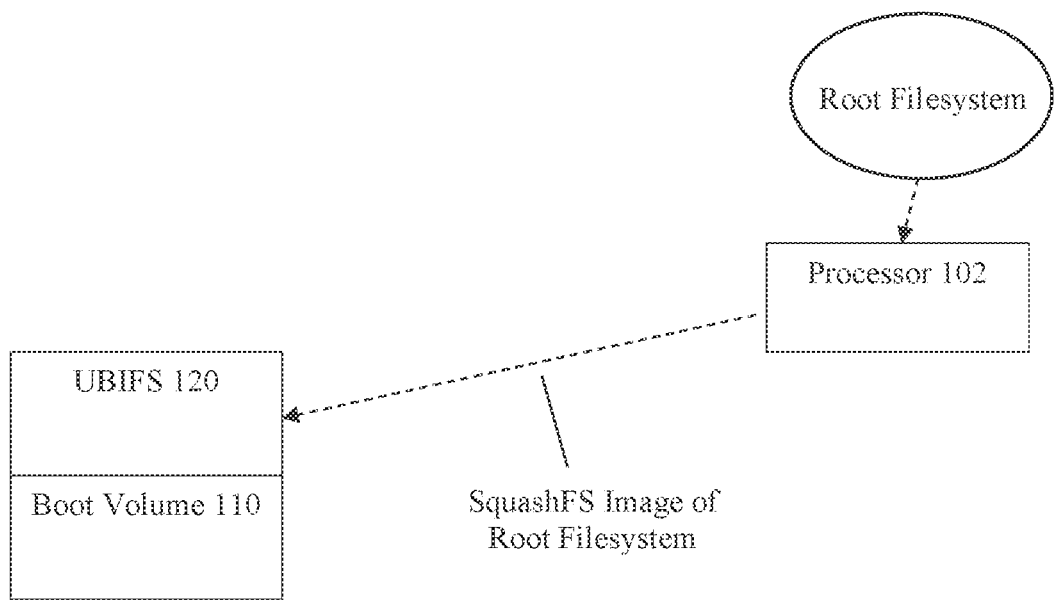
FIG. 3 is an exemplary block diagram showing an exemplary writing process involving squashfs images being written to a UBIFS.
Figure 4:
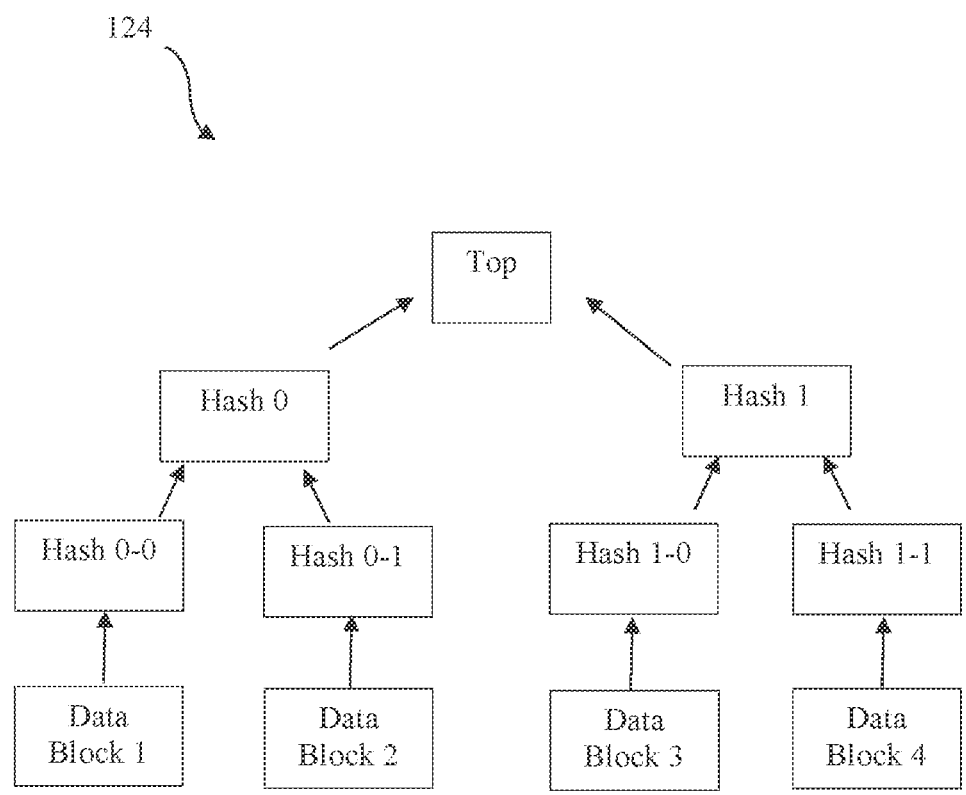
FIG. 4 shows an exemplary hash tree that may be used with an embodiment of the device-mapper engine.

Referring to FIGS. 3-4, the digital image processing device 100 can include an Unsorted Block Image File System (UBIFS) 120. For instance, the processor 102 can be programed to operate via an UBIFS 120. A UBIFS 120 is a flash file system that can be used for unmanaged flash memory devices. In some embodiments, the UBIFS 120 can be configured to work on top of an Unsorted Block Image (UBI) layer. UBI is an erase block management layer that can be used for flash memory devices. In some embodiments, the UBI can be configured to provide tracking of bad blocks in the NAND flash 104.

Due to the partitioning scheme of the boot volume 110 and the mapping operation of the software image within the boot volume 110, there is only one copy of the root filesystem in the NAND flash boot volume 110. Thus, a copy of the root filesystem can be stored in the UBIFS 120. This can be achieved by the processor 102 compressing a copy of the root filesystem into a squashfs image. Generally, a squashfs is a compressed read-only file system that uses compression algorithms to compress files and directories, which can support block sizes ranging from 4 KiB to 1 MiB. The processor 102 can then cause the squashfs image to be written directly to the NAND flash 104 via a skip-block algorithm, as opposed to creating an UBI layer on top of the rootdisk partition 116.

The squashfs image, when written to the NAND flash 104, can then be mounted directly from the NAND flash 104 and/or from the UBIFS 120. For instance, the device-mapper engine 118 can include a pre-calculated hash tree 124 comprising hashes of all device blocks 126. The leaf nodes of the hash tree 124 include hashes of physical device blocks, while intermediate nodes are hashes of child nodes of each physical device block. The hash tree 124 can also have a root node positioned at the top of the hash tree 124, which can be referred to as the root hash. The root hash can be based on all of the lower level hashes (e.g., a change in a single device block will result in a change of the root hash). The device-mapper engine 118 can also include a mapping table comprising the locations of the target device(s). When a squashfs image is generated, the mapping table is parsed so that the parsed mapping table is used to create a virtual block device of the squashfs image corresponding to a physical block device within the mapping table. The virtual block device is then mounted at the mount point according to the mapping table in place of the corresponding physical device.

The ability to mount the squashfs image directly from the NAND flash 104 and/or from a UBIFS 120 volume, when writing the squashfs image to the NAND flash 104, provides the ability to upgrade in the background and improves boot time by obviating the need to copy of the root filesystem from the NAND flash 104 to UBIFS 120 (with typical memory set-ups, squashfs image would be installed on top of a UBI layer inside a UBIFS volume, leading to a higher overhead cost). As an example, the overhead for a 64 MB partition is shown below.

[258374.400000] UBIFS: default file-system created
[258374.741000] UBIFS: mounted UBI device 1, volume 0, name "waltfs"
[258374.748000] UBIFS: file system size: 57802752 bytes (56448 KiB, 55 MiB, 112 LEBs)
[258374.755000] UBIFS: journal size: 4128769 bytes (4032 KiB, 3 MiB, 6 LEBs)
[258374.763000] UBIFS: media format: w4/r0 (latest is w4/r0)
[258374.769000] UBIFS: default compressor: lzo
[258374.773000] UBIFS: reserved for root: 2730166 bytes (2666 KiB)

The effective user space is 55 MiB after a UBI/UBIFS layer is added. By allowing a squashfs to be written directly to the NAND flash 104, however, a 9 MiB gain in the NAND flash 104 is achieved.

The digital image processing device 100 can include a scan utility 128 (e.g., the processor 102 can be programed to operate via a scan utility 128). The scan utility 128 can be a software module configured to identify bad blocks of data within NAND flash 104, thereby allowing the squashfs image to be mounted directly from the NAND flash 104 in a manner that overcomes bad blocks associated with the NAND flash 104. A bad block is an area within a storage media (e.g., the NAND flash 104) that can no longer be written to or read from (e.g., no longer accessible) due to a data corruption that occurred within the data block associated with that area or due to physical damage to the storage media effecting that area. As a consequence, this that area is no longer reliable for storing and retrieving data. With NAND flash 104 type storage media, a common occurrence leading to a bad data block is the NAND flash 104 substrate becoming unusable after a certain number of program-erase cycles. Generally, the erase process sends a large electrical charge through the flash cell, which tends to degrade the oxide layer that separates the floating gate transistors from the flash memory substrate, leading to increasing bit error rates. In other words, data blocks can turn into bad data blocks by being worn from use.

Embodiments of the scan utility 128 can scan the NAND flash 104 to identify the bad data blocks. This can be achieved by attempting an overwrite on the data block with new data, wherein not being able to do so is used as an indicator that the data block is bad. In addition to not using the bad data blocks (e.g., remapping the bad blocks to a different area in the storage media so as to prevent use in the future—a technique typically used with typical scan utilities), the scan utility 128, along with the operations of the device-mapper engine 118, can be used to make the squashfs image whole again.

For instance, the NAND flash 104 of the squashfs image can be comprised of a plurality of data blocks representative of the squashfs image. If any of the data blocks of the squashfs image are bad data blocks, the squashfs image cannot be mounted (e.g., the virtual block device(s) cannot be mounted at a mount point according to the mapping table). The scan utility 128 can perform a scan to identify any bad data blocks associated with the squashfs image (e.g., attempt an overwrite on a data block with new data, wherein not being able to do so is used as an indicator that the data block is bad). The scan utility 128 can then generate a block table that identifies the good data blocks and/or bad data blocks. The device-mapper engine 118 can use the block table to extract good data blocks from the hash tree 124 and replace the bad data blocks with the good data blocks. Thus, the device-mapper engine 118 can use the block table to render a complete squashfs image (or a complete rootdisk image of the root file) by de-fragmenting the squashfs image to make it whole again. Thereafter, the device-mapper engine 118 can mount the squashfs image as discussed above.

Figure 5:
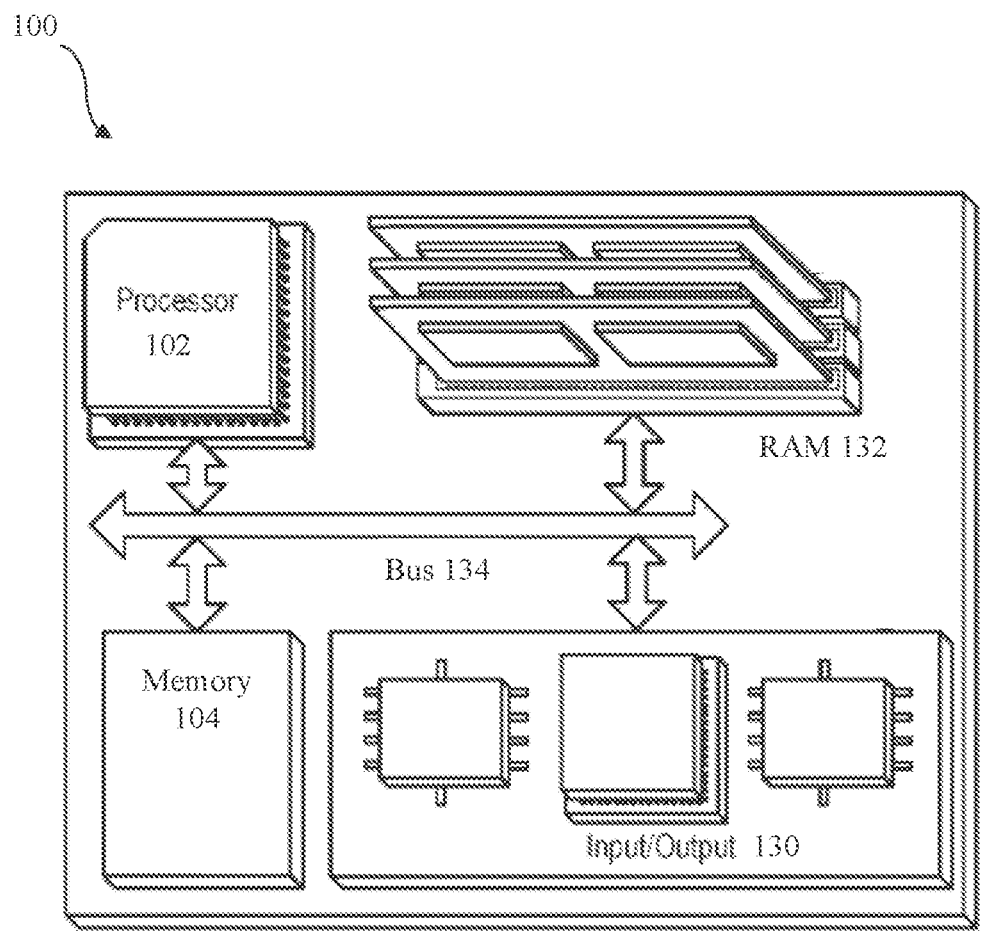
FIG. 5 shows an exemplary hardware architecture for an embodiment of the digital image processing device.

Referring to FIG. 5, embodiments of the digital image processing device 100 can be configured to act as a network node equipped to interface with a communication device 106. FIG. 5 shows an exemplary architecture for the digital image processing device 100. The digital image processing device 100 can include an input/output device 130 configured to provide input/output operations for the digital image processing device 100. In some embodiments, the input/output device 130 can include driver devices configured to receive input data and send output data to the communication device 106, as well as send communications to, and receive communications from, various networks.

The digital image processing device 100 can include the processor 102, the memory 104, a RAM memory 132, and the input/output device 130. Each of these components can, for example, be interconnected using a system bus 134. The processor 102 is capable of processing instructions for execution within the digital image processing device 100. The processor 102 can be a single-threaded processor or a multi-threaded processor. The processor 102 is capable of processing instructions stored in the memory 104 or on the RAM 132. The memory 104 stores information within the digital image processing device 100. The memory 104 can include a computer-readable medium, a volatile memory unit, a non-volatile memory unit, etc. The RAM 132 is capable of providing mass storage for the digital image processing device 100.

The digital image processing device 100, and components thereof, can be realized by instructions that, upon execution, cause one or more processing devices to carry out the processes and functions embedded in software stored within the memory 104 or RAM 132. Such instructions can, for example, comprise interpreted instructions, such as script instructions, e.g., JavaScript or ECMAScript instructions, or executable code, or other instructions stored in a computer readable medium.

Implementations of the subject matter and the functional operations described in this specification can be provided in digital electronic circuitry, or in computer software, firmware, or hardware, including the structures disclosed in this specification and their structural equivalents, or in combinations of one or more of them. Embodiments of the subject matter described in this specification can be implemented as one or more computer program products, e.g., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine generated electrical, optical, or electromagnetic signal that is generated to encode information for transmission to suitable receiver apparatus for execution by a computer. The computer readable medium can be a machine readable storage device, a machine readable storage substrate, a memory device, a composition of matter effecting a machine readable propagated signal, or a combination of one or more of them.

The term "processor" encompasses all apparatus, devices, and machines for processing data, including by way of example a programmable processor, a computer, or multiple processors or computers. The processor can include, in addition to hardware, code that creates an execution environment for the computer program in question (e.g., code that constitutes processor firmware, a protocol stack, a database management system, an operating system, or a combination of one or more of them).

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer (or processor) or on multiple computers (or multiple processors) that are located at one site or distributed across multiple sites and interconnected by a communication network.

The processes and logic flows described in this specification are performed by one or more programmable processors executing one or more computer programs to perform functions by operating on input data and generating output thereby tying the process to a particular machine (e.g., a machine programmed to perform the processes described herein). The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors (general microprocessors being transformed into special purpose microprocessor through the application of algorithms described herein), and any one or more processors of any kind of digital computer. Generally, a processor will receive instructions and data from a read only memory or a random access memory or both. The elements of a computer typically include a processor for performing instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks). However, a computer need not have such devices. Moreover, a computer can be embedded in another device (e.g., a mobile communications device, a phone, a cable modem, a set-top box, a mobile audio or video player, or a game console, to name just a few).

Computer readable media suitable for storing computer program instructions and data include all forms of non-volatile memory, media and memory devices, including by way of example semiconductor memory devices, e.g., erasable programmable read-only memory (EPROM), electronically erasable programmable read-only memory (EEPROM), and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be operable to interface with a computing device having a display, e.g., a LCD (liquid crystal display) monitor, for displaying information to the user and a keyboard and a pointing device (e.g., a mouse or a trackball, remote, or any other device by which the user can provide input to the computer). Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

While this specification contains many specific implementation details, these should not be construed as limitations on the scope of any invention or of what can be claimed, but rather as descriptions of features that can be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results, unless expressly noted otherwise. As one example, the processes depicted in the accompanying figures do not necessarily require the particular order shown, or sequential order, to achieve desirable results. In some implementations, multitasking and parallel processing can be advantageous.

What is claimed is:

1. A digital image processing device, comprising:
a memory, comprising:
a NOT-AND (NAND) flash memory having a boot volume, the boot volume including:
a primary boot partition configured to store a kernel component of a file,
a secondary boot partition configured to store a copy of the kernel component of the file, wherein the secondary boot partition is a back-up of the primary boot partition, and
a rootdisk partition configured to store a root filesystem of the file; and
a processor in operative association with the memory, the processor configured to operate via a device-mapper engine, wherein the processor is configured to:
split the file into the kernel component and the root filesystem;
generate a Squash File System (squashfs) image of a copy of the root filesystem;
write the squashfs image to the NAND flash memory; and
mount the squashfs image directly from the NAND flash.

2. The digital image processing device of claim 1, wherein:
the file comprises a software package or a software package update.

3. The digital image processing device of claim 1, wherein the device-mapper engine is configured to:
send the kernel component to the primary boot partition;
send the copy of the kernel component to the secondary boot partition; and
send the root filesystem to the rootdisk partition.

4. The digital image processing device of claim 1, wherein:
the memory comprises an Unsorted Block Image File System (UBIFS); and
the processor configured to store a copy of the root filesystem in the UBIFS.

5. The digital image processing device of claim 1, wherein:
the processor is configured to write the squashfs image to the NAND flash memory via a skip-block algorithm.

6. The digital image processing device of claim 1, wherein:
the processor is configured to operate via a scan utility, the scan utility configured to identify bad data blocks.

7. The digital image processing device of claim 6, wherein:
the scan utility is configured to generate a block table comprising the bad data blocks.

8. The digital image processing device of claim 7, wherein:
the squashfs image is fragmented due to bad data blocks; and
the device-mapper engine is configured to use the block table to render a complete squashfs image.

9. A method for improving memory capacity in a NOT-AND (NAND) flash memory, the method comprising:
partitioning a boot volume of the NAND flash into a primary boot partition, a secondary boot partition, and a rootdisk partition;
storing a kernel component of a file within the primary boot partition;
storing a copy of the kernel component of the file within the secondary boot partition, wherein the secondary boot partition is a back-up of the primary boot partition;
storing a root filesystem of the file within the rootdisk partition;

splitting a file into a kernel component and a root filesystem;
generating a Squash File System (squashfs) image of a copy of the root filesystem;
writing the squashfs image to the NAND flash memory; and
mounting the squashfs image directly from the NAND flash.

10. The method of claim 9, wherein:
the file comprises a software package or a software package update.

11. The method of claim 9, further comprising:
scanning the NAND via a scan utility, the NAND containing one or more data blocks;
identifying bad data blocks wherein identifying the bad data blocks includes:
  attempting to overwrite a data block of the one or more data blocks with new data;
  determining that the data block of the one or more data blocks cannot be overwritten with the new data; and
  generating a block table comprising the bad data blocks.

12. The method of claim 11, wherein the squashfs image is fragmented due to bad data blocks; and
rendering a complete squashfs image using the block table.

* * * * *